(12) United States Patent
Caldwell

(10) Patent No.: US 6,713,897 B2
(45) Date of Patent: Mar. 30, 2004

(54) TOUCH SWITCH WITH INTEGRAL CONTROL CIRCUIT

(75) Inventor: David W. Caldwell, Naperville, IL (US)

(73) Assignee: Touchsensor Technologies, LLC, Wheaton, IL (US)

( * ) Notice: Subject to any disclaimer, the term of this patent is extended or adjusted under 35 U.S.C. 154(b) by 0 days.

(21) Appl. No.: 10/027,884

(22) Filed: Oct. 25, 2001

(65) Prior Publication Data

US 2002/0057020 A1 May 16, 2002

Related U.S. Application Data

(63) Continuation of application No. 09/234,150, filed on Jan. 19, 1999, now Pat. No. 6,320,282.

(51) Int. Cl.[7] .............................................. H01H 47/00
(52) U.S. Cl. ..................... 307/125; 307/109; 307/139; 307/652; 341/33; 200/512
(58) Field of Search ................................ 307/652, 109, 307/125, 139; 341/33; 200/512

(56) References Cited

U.S. PATENT DOCUMENTS

| | | | |
|---|---|---|---|
| 3,200,306 A | 8/1965 | Atkins et al. ............... 317/146 |
| 3,254,313 A | 5/1966 | Atkins et al. ............... 331/111 |
| 3,275,897 A | 9/1966 | Atkins ........................ 317/146 |
| 3,909,625 A | 9/1975 | Colglazier .................. 307/116 |
| 3,944,843 A | 3/1976 | Vaz Martins ............... 307/116 |
| 3,974,472 A | 8/1976 | Gould ......................... 340/337 |
| 4,016,490 A | 4/1977 | Weckenmann et al. ....... 324/61 |
| 4,090,092 A | 5/1978 | Serrano ...................... 307/116 |
| 4,091,610 A | 5/1978 | Sasaki et al. .................. 58/23 |
| 4,123,631 A | 10/1978 | Lewis ........................ 200/52 |
| 4,175,239 A | 11/1979 | Sandler ...................... 307/116 |
| 4,221,975 A | 9/1980 | Ledniczki et al. .......... 307/116 |
| 4,257,117 A | 3/1981 | Besson ........................ 368/69 |
| 4,263,618 A | * 4/1981 | Wine .......................... 358/188 |
| 4,291,303 A | 9/1981 | Cutler et al. ................ 340/711 |
| 4,295,132 A | 10/1981 | Burney et al. .............. 340/562 |
| 4,321,479 A | 3/1982 | Ledniczki et al. .......... 307/116 |
| 4,345,167 A | 8/1982 | Calvin ........................ 307/308 |
| 4,352,552 A | 10/1982 | Stange .......................... 355/4 |
| 4,363,029 A | * 12/1982 | Piliavin et al. ............. 340/501 |
| 4,379,287 A | 4/1983 | Tyler et al. ................. 340/365 |
| 4,380,040 A | 4/1983 | Posset ........................ 361/280 |
| 4,394,643 A | 7/1983 | Williams .................... 340/365 |
| 4,400,758 A | 8/1983 | Frame ........................ 361/290 |
| 4,405,917 A | 9/1983 | Chai .......................... 340/365 |
| 4,405,918 A | 9/1983 | Wall et al. .................. 340/365 |
| 4,529,968 A | 7/1985 | Hilsum et al. .............. 340/365 |
| 4,535,254 A | 8/1985 | Khatri ......................... 307/38 |
| 4,550,310 A | 10/1985 | Yamaguchi et al. ........ 340/365 |
| 4,556,871 A | 12/1985 | Yoshikawa et al. ......... 340/365 |
| 4,561,002 A | 12/1985 | Chiu .......................... 340/365 |

(List continued on next page.)

FOREIGN PATENT DOCUMENTS

| | | |
|---|---|---|
| DE | 2311249 | 9/1973 |
| DE | 2739786 | 3/1979 |
| DE | 3242621 | 5/1984 |
| GB | 1464094 | 2/1977 |
| GB | 2115553 | 9/1983 |

*Primary Examiner*—Brian Sircus
*Assistant Examiner*—Robert Deberadinis
(74) *Attorney, Agent, or Firm*—Jenner & Block, LLC

(57) ABSTRACT

A touch switch apparatus for detecting the presence of an object such as a human appendage, the apparatus having a touch pad and a local control circuit connected to the touch pad and to a controlled device. The touch pad preferable includes a first electrode and a second electrode spaced from and surrounding the first electrode. The control circuit is preferably in integrated circuit form. A signal is provided to the touch pad to generate an electric field thereabout. Introduction of a stimulus near the touch pad disturbs the electric field. The control circuit detects the electric field disturbance in and generates a control signal in response.

12 Claims, 7 Drawing Sheets

U.S. PATENT DOCUMENTS

| | | | |
|---|---|---|---|
| 4,562,315 A | 12/1985 | Aufderheide | 200/5 |
| 4,584,519 A | 4/1986 | Gruodis | 323/245 |
| 4,651,033 A | 3/1987 | Yasutake et al. | 307/494 |
| 4,651,133 A | 3/1987 | Ganesan et al. | 340/365 |
| 4,663,542 A | 5/1987 | Buck et al. | 307/308 |
| 4,731,548 A | 3/1988 | Ingraham | 307/116 |
| 4,733,222 A | 3/1988 | Evans | 340/365 |
| 4,740,781 A | 4/1988 | Brown | 340/712 |
| 4,758,735 A | 7/1988 | Ingraham | 307/116 |
| 4,831,279 A | 5/1989 | Ingraham | 307/116 |
| 4,855,550 A | 8/1989 | Schultz, Jr. | 200/600 |
| 4,924,222 A | 5/1990 | Antikidis et al. | 341/33 |
| 5,012,124 A | 4/1991 | Hollaway | 307/116 |
| 5,063,306 A | 11/1991 | Edwards | 307/308 |
| 5,087,825 A | 2/1992 | Ingraham | 307/132 |
| 5,153,572 A | 10/1992 | Caldwell et al. | 340/712 |
| 5,155,338 A | 10/1992 | Hoffmann | 219/451 |
| 5,189,417 A | 2/1993 | Caldwell et al. | 341/26 |
| 5,194,862 A | 3/1993 | Edwards | 341/20 |
| 5,239,152 A | 8/1993 | Caldwell et al. | 200/600 |
| 5,270,710 A | 12/1993 | Gaultier et al. | 341/33 |
| 5,457,289 A | 10/1995 | Huang et al. | 178/20 |
| 5,495,077 A | 2/1996 | Miller et al. | 178/18 |
| 5,508,700 A | 4/1996 | Taylor et al. | 341/33 |
| 5,526,294 A | 6/1996 | Ono et al. | 364/709.13 |
| 5,594,222 A | 1/1997 | Caldwell | 200/600 |
| 5,760,715 A | 6/1998 | Senk et al. | 341/33 |
| 5,796,183 A * | 8/1998 | Hourmand | 307/116 |
| 5,959,687 A * | 9/1999 | Dinwiddle et al. | 348/564 |
| 6,268,753 B1 | 7/2001 | Sandusky | 327/266 |
| 6,310,611 B1 | 10/2001 | Caldwell | 345/173 |

* cited by examiner

TOUCH SWITCH WITH INTEGRAL CONTROL CIRCUIT

CROSS REFERENCE TO RELATED APPLICATIONS

This application is a continuation of, and claims priority from, application Ser. No. 09/234,150 filed on Jan. 19, 1999 now U.S. Pat. No. 6,320,282.

FIELD OF THE INVENTION

The present invention relates to touch panel systems and, more particularly, to touch switches (i.e., switches that are operated, for example, by touching a finger to or about a touch pad) and related control circuits for use as replacements for mechanical switches.

BACKGROUND OF THE INVENTION

Mechanical switches have long been used to control apparatus of all types, including household appliances, machine tools, and other domestic and industrial equipment. Mechanical switches are typically mounted on a substrate and require some type of penetration through the substrate. These penetrations, as well as penetrations in the switch itself, can allow dirt, water and other contaminants to pass through the substrate or become trapped within the switch, thus leading to electrical shorts and other malfunctions.

Touch switches are often used to replace conventional mechanical switches. Unlike mechanical switches, touch switches contain no moving parts to break or wear out. Moreover, touch switches can be mounted or formed on a continuous substrate sheet, i.e. a switch panel, without the need for openings in the substrate. The use of touch switches in place of mechanical switches can therefore be advantageous, particularly in environments where contaminants are likely to be present. Touch switch panels are also easier to clean than typical mechanical switch panels because they can be made without openings in the substrate that would allow penetration of contaminants.

Known touch switches typically comprise a touch pad having one or more electrodes. The touch pads communicate with control or interface circuits which are often complicated and remote from the touch pads. A signal is usually provided to one or more of the electrodes comprising the touch pad, creating an electric field about the affected electrodes. The control/interface circuits detect disturbances to the electric fields and cause a response to be generated for use by a controlled device.

Although touch switches solve many problems associated with mechanical switches, known touch switch designs are not perfect. For example, many known touch switches can malfunction when contaminants such as water or other liquids are present on the substrate. The contaminant can act as a conductor for the electric fields created about the touch pads, causing unintended switch actuations. This presents a problem in areas where such contaminants are commonly found, such as a kitchen and some factory environments.

Existing touch switch designs can also suffer from problems associated with crosstalk, i.e., interference between the electric fields about adjacent touch pads. Crosstalk can cause the wrong touch switch to be actuated or can cause two switches to be actuated simultaneously by a touch proximate a single touch pad.

Many known touch switch designs are also susceptible to unintended actuations due to electrical noise or other interferences affecting a touch pad itself, or the leads extending from the touch pad to its associated control circuit. This problem can be aggravated in applications where the touch pad is a relatively large distance away from the control circuitry, as is frequently the case with conventional touch switch designs.

Existing touch switch designs commonly require complicated control circuits in order to interface with the devices they control. These control circuits are likely to be comprised of a large number of discrete components which occupy considerable space on a circuit board. Because of their physical size, the control circuits are typically located at a substantial distance from the touch pads themselves. The physical size of the control/interface circuits and their remoteness from the touch pads can aggravate many of the problems discussed above, such as crosstalk and susceptibility to electrical noise and interference. The size and remoteness also complicate the overall touch switch panel design, resulting in increased production cost and complexity.

Some known touch switch designs require a separate grounding lead from the touch pad to the interface/control circuit or to the controlled device. Certain apparatus utilizing conventional mechanical switches do not require, and may not readily accommodate, such grounding leads. Adapting such apparatus for use with such touch switches can require the addition of special grounding provisions, thus increasing design and production time, complexity, and cost. These ground lead requirements can preclude simple, direct replacement of conventional mechanical switch panels with touch switch panels.

Recent improvements in touch switch design include techniques which lower the input and output impedance of the touch switch itself, thereby making it highly immune to false actuations due to contaminants and external noise sources. U.S. Pat. No. 5,594,222 describes a low impedance touch switch design which is less susceptible to malfunction in the presence of contaminants and electrical noise than many previous designs. Even though this approach has several advantages over the prior art, there are some attributes that may limit its application. For instance, the resulting switch may be sensitive to temperature variations. As long as the temperature variations at the output are small relative to legitimate signal changes and are small relative to signal variations induced by transistor variations, then a single transistor or other amplifying device will be quite satisfactory. However, this technique may require the use of additional circuitry to interface with the controlled device, thus increasing cost and complexity to the overall touch switch design. In applications where there is little dynamic range to allow for compensation, and where temperature changes are significant relative to legitimate signal changes, a different approach may be better able to eliminate or reduce the effects of temperature.

Also, even though the low impedance approach of this technique can differentiate between contaminants with some finite amount of impedance and a human touch with some finite amount of impedance, this technique may not be enough to differentiate between extremely low levels of impedance. Such a situation could exist when an entire touch switch (i.e., both the inner and outer electrode) is covered with a large amount of contaminant. A similar, essentially zero-impedance, situation could exist when a conductive material, such as a metal pan, entirely covers a touch switch.

U.S. patent application Ser. No. 08/986,927, assigned to the same assignee as the present application, and hereby incorporated by reference herein, discloses a touch switch apparatus having a differential measuring circuit which addresses many of the problems related to common mode disturbances affecting touch switches. For example, a touch switch having a two-electrode touch pad can be configured to generate an electric field about each electrode. A common mode disturbance, such as a contaminant substantially covering both electrodes, is likely to affect the electric field about each of the electrodes substantially equally. Each electrode provides a signal proportional to the disturbance to the differential measuring circuit. Since the signals from the electrodes are therefore contemplated to be substantially equal, the differential measuring circuit does not sense a differential and does not respond to the common mode disturbance. On the other hand, if the field about only one of the electrodes is disturbed, the signal provided by that electrode to the differential measuring circuit will likely be substantially different than that provided by the other, non-affected electrode. The differential circuit can respond by providing an output which causes a switch actuation.

Although the differential measuring circuit approach addresses many problems known in the prior art, it is relatively complex and can be costly to design and manufacture. A differential measuring circuit typically comprises many more parts than a more conventional control circuit. The additional parts are likely to take up more space on a touch switch panel. As such, the control circuit is likely to be even farther from the touch pad than it might be with a non-differential circuit design, requiring long leads between the touch pad and its control circuit. This can actually aggravate concerns related to electrical interference. Furthermore, when building a differential measuring circuit, matching of components becomes important. Proper component matching presents an additional manufacturing burden and is likely to add cost.

Although the foregoing improvements can reduce unintended switch actuations as a result of crosstalk between switches and the effects of electrical interference on their control circuits, they do not eliminate these problems completely. Furthermore, they do not address the need for separate grounding circuits in certain touch switch applications or resolve the concerns related thereto.

SUMMARY OF INVENTION

It is an object of the invention to provide a reliable touch switch apparatus which is substantially unaffected by the presence of contaminants, electrical interference, and other disturbances proximate the touch switch and its associated control circuitry so as to prevent unintended switch actuation when the touch switch is affected by such disturbances.

It is also an object of the invention to simplify the interface requirements between touch switches and the many different applications in which they can be used, so that touch switch panels can readily serve as direct, plug-in replacements for mechanical switch panels.

The present invention provides a touch switch apparatus comprising a touch pad and a control circuit located near the touch pad. The touch pad and control circuit may be mounted on a dielectric substrate. The control circuit is small compared to the overall size of the apparatus. In a preferred embodiment, the control circuit is substantially reduced to one or more integrated circuits. The physical compactness of the control circuit in the integrated circuit embodiment reduces the touch switch's susceptibility to common mode interference and to crosstalk and interference between adjacent touch switches. The integrated circuit approach also provides for better matching and balancing of the control circuit components.

The touch switch of the present invention can be configured in a variety of preferred embodiments. In some embodiments, the touch switch can emulate a conventional, maintained-contact type of mechanical switch. In other embodiments, the touch switch can emulate a momentary-contact type of mechanical switch.

In a preferred embodiment, the touch pad has a first electrode and a second electrode proximate the first electrode. At least one of the electrodes is electrically coupled to the local control circuit. The first and second electrodes and the local control circuit are typically placed on the same surface of a substrate, opposite the side of the substrate to be used as the touch surface. However, they need not be coplanar, and may be placed on opposite sides of a substrate.

In an alternate embodiment, the touch pad has a single electrode which is electrically coupled to the local control circuit. In other alternate embodiments, the touch pad can have more than two electrodes.

In a preferred embodiment, the control circuit includes means for generating a signal and providing it to the touch pad to create an electric field about one or more of the electrodes comprising the touch pad. Alternatively, such a signal may be generated elsewhere and provided to one or more of the electrodes to create one or more electric fields thereabout. The control circuit detects disturbances to the electric fields in response to stimuli thereto, such as a user's fingertip contacting or approaching the substrate adjacent the touch switch. The control circuit selectively responds to such field disturbances by generating a control signal for use by a controlled device, such as a household appliance or an industrial machine.

In a preferred embodiment, the control circuit detects and responds to differences in electrical potential between the first and second electrodes in response to the introduction of a stimulus in proximity to either the first electrode, the second electrode, or both. Such differential measuring circuit provides for the rejection of common mode signals (i.e., signals that would tend to affect both electrodes approximately equally) such as temperature, electrical noise, power supply variations, and other inputs. The differential measuring circuit also provides for the rejection of common mode signals resulting from the application of contaminants to the substrate adjacent the touch switch.

In a preferred embodiment, a signal is applied to a first electrode and to a second electrode. An electric potential is developed at each electrode, and, consequently, an electric field is generated each of the electrodes. Two matched transistors are arranged in a differential measuring circuit, with the first transistor connected to the first electrode and the second transistor connected to the second electrode. Each transistor's output is connected to a peak detector circuit, and the output of each peak detector circuit is in turn provided to a decision circuit.

Each transistor's output is altered when the electric field about its corresponding electrode is altered, such as when the electrode is touched or approached by a user. The peak detector circuits respond to changes in the transistors' outputs and provide signals corresponding to the peak potentials from the transistors to the decision circuit. The decision circuit uses the peak potentials in a predetermined manner to provide an output for use by other portions of the control circuit.

In a preferred embodiment, the inner and outer electrodes are operably associated with the inputs to the decision circuit such that when a disturbance to an electric field about a first electrode is greater than the degree of disturbance of an electric field about a second electrode, the decision circuit will provide a high level output. Conversely, the decision circuit will provide a low level output when a disturbance to the electric field about the second electrode is greater than the degree of disturbance of an electric field about the first electrode. When the fields about both electrodes are disturbed more or less equally, the decision circuit will provide a low level output.

The first condition can be created, for example, when a fingertip substantially covers the first electrode but not the second electrode. The second condition can be created, for example, when a fingertip or contaminant substantially covers the second electrode but not the first electrode. The third condition can be created, for example, when a contaminant or an object, such as a metal pan, covers both the first and second electrodes.

The decision circuit output is provided to other circuit components, such as an electrical latch, which selectively cause a control signal to be output from the control circuit, depending on the decision circuit output state. In a preferred embodiment, a high level output from the decision circuit ultimately causes a control signal to be output from the control circuit, while no control signal will be output in response to a low level output. In an alternate embodiment, a low level output from the decision circuit causes a control signal to be output from the control circuit, while no control signal will be output in response to a high level output.

The touch switch apparatus of the present invention can be used to perform almost any function which can be performed by a mechanical switch, such as turning a device on or off, adjusting temperature, or setting a clock or timer. It can be used in place of, and solve problems associated with, existing touch switches. It can also be used as a direct replacement for mechanical membrane-type switches. The touch switch apparatus of the present invention is well suited for use in environments where temperature variations are extreme, where substantial amounts of contaminants can be present or where metal objects may be placed on or over the touch pad.

BRIEF DESCRIPTION OF THE DRAWINGS

The various features, advantages and other uses of the present invention will become more apparent by referring to the following detailed description and drawings in which.

Similar indicia numbers in the various Figures indicate similar elements.

DESCRIPTION OF THE PREFERRED EMBODIMENTS

Figure 1:
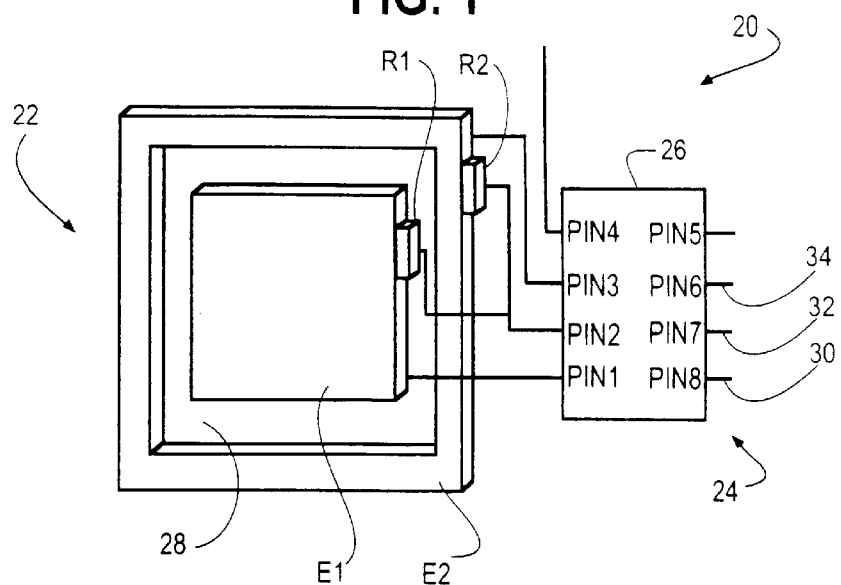
FIG. 1 is a perspective drawing of the components of a preferred embodiment of a touch switch of the present invention.

The invention pertains to a touch switch apparatus comprising a touch pad having one or more electrodes and a control circuit. Many of the drawing figures illustrating the control circuit depict the circuit as large in relation to the touch pad, for clarity. In typical applications, however, the control circuit may be small compared to the touch pad, and is preferably in the form of one or more integrated circuit chips.

FIG. 1 is a perspective representation of one preferred embodiment of a touch switch apparatus 20 of the present invention. Touch switch apparatus 20 comprises a touch pad 22, a control circuit 24 comprising an integrated circuit (IC) chip 26 having eight output terminals PIN1–PIN8, and first and second resistors R1 and R2. In the embodiment shown, touch pad 22 comprises a first electrode E1 and a second electrode E2, although the touch pad may also be comprised of more or fewer than two electrodes. Although control circuit 24 could be fabricated using discrete electronic components, it is preferable to embody control circuit 24 in a single integrated circuit chip, such as IC chip 26.

Control circuit 24, via terminals PIN1–PIN8 of IC chip 26, is electrically coupled to, and communicates with, first and second resistors R1 and R2, first and second electrodes E1 and E2, and an input line 30 which is configured to supply a control and/or power signal from a remote device (not shown). Control circuit 24 also communicates with a remote device (not shown) using a first output line 32. In some embodiments, a second output line 34 is also used for communication with the remote device (not shown).

Figure 2:
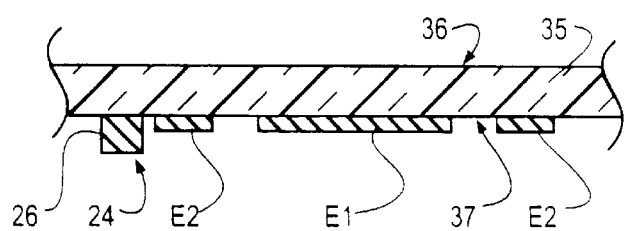
FIG. 2 is a cross-sectional view of a two-electrode touch pad and integrated circuit chip of the present invention.

FIG. 2 is a partial cross-sectional view of a typical touch switch 20 of the present invention in which the components comprising touch switch apparatus 20 are mounted on a dielectric substrate 35 having a front surface 36 and an opposing rear surface 37. In the embodiment shown, first and second electrodes E1 and E2 are mounted on rear surface 37 of substrate 35. IC chip 26 is also mounted on rear surface 37 of substrate 35, proximate first and second electrodes E1 and E2. As can be seen from both FIGS. 1 and 2, in the preferred embodiment it is contemplated that IC chip 26 comprising control circuit 24 be mounted in close proximity to touch pad 22.

Substrate 35 is typically comprised of a relatively rigid dielectric material, such as glass, plastic, ceramic, or any other suitable dielectric material. However, substrate 35 may also comprise any other suitable dielectric material, including flexible materials. Consolidated Graphics No. HS-500, Type 561, Level 2, a 0.005 inch thick polyester material, is an example of a suitable flexible substrate. In embodiments where the touch switch apparatus components are mounted on a flexible substrate, the flexible carrier is often subsequently applied to another, generally more rigid, substrate.

In a preferred embodiment, substrate 35 is made of glass having a uniform thickness of about 3 mm. In other embodiments, the thickness of substrate 35 may vary, depending on the type of material used, its mechanical and electrical properties, and the physical strength and electrical sensitivity required for a particular application. The maximum functional thickness for glass and plastic substrates is on the order of several inches. However, in most practical applications, glass substrates range in thickness from about 1.1 mm to about 5 mm, while plastic substrates can be even thinner.

In a preferred embodiment, as shown in FIGS. 1 and 2, second electrode E2 substantially surrounds first electrode E1. A space 28 is located between first electrode E1 and second electrode E2. First electrode E1 may be dimensioned such that it may be "covered" by a user's fingertip or other human appendage when the user touches the corresponding portion of front surface 36 of substrate 35. In one preferred embodiment, first electrode E1 is square and second electrode E2 is arranged in a square pattern about and conforming to the shape of first electrode E1.

Although the touch pad geometry illustrated in FIGS. 1 and 2 represents a preferred arrangement of first and second electrodes E1 and E2, it should be recognized that the electrode arrangement may be varied extensively to accommodate a wide variety of applications. For example, the electrode size, shape, and placement may be varied to accommodate the size of the appendage or other stimulus contemplated to actuate touch switch 20. For example, a particular application might require that a hand, rather than a finger, provide the stimulus to actuate touch switch 20. In such an application, first and second electrodes E1 and E2 would be much larger and spaced farther apart.

Figure 3:
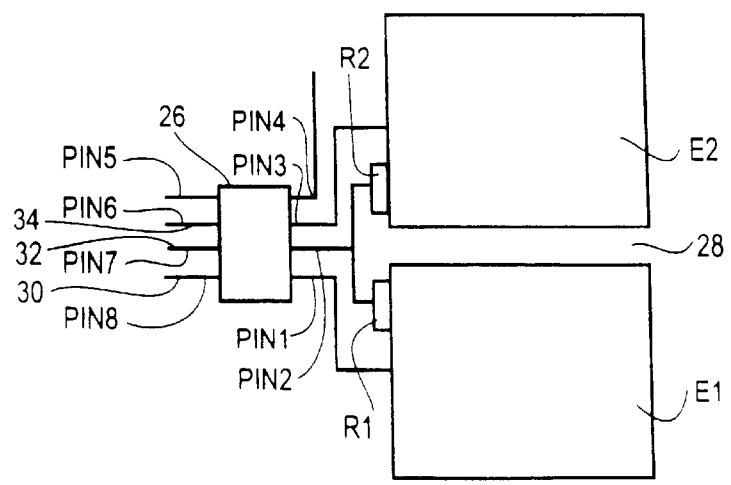
FIG. 3 is a plan view of an embodiment of a touch switch apparatus of the present invention.

First electrode E1 may take any number of different geometric shapes, including, but not limited to, rectangles, trapezoids, circles, ellipses, triangles, hexagons, and octagons. Regardless of the shape of first electrode E1, second electrode E2 can be configured to at least partially surround first electrode E1 in a spaced-apart relationship. However, it is not necessary for second electrode E1 to surround the first electrode even partially in order to obtain the benefits of the invention. For example, first and second electrodes E1 and E2 can be adjacent to each other, as shown in FIG. 3. In alternative embodiments, second electrode E2 may be omitted.

Figure 8:
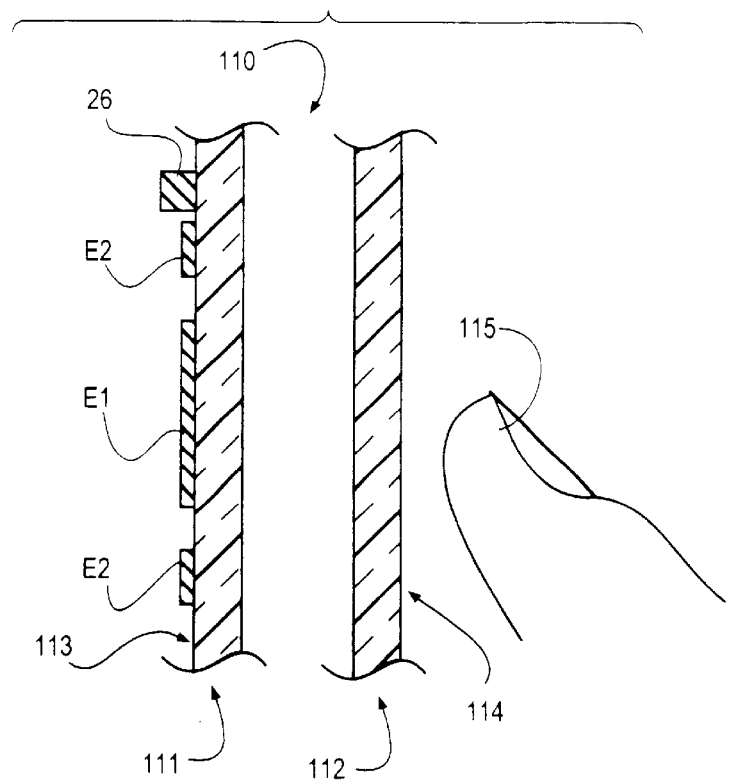
FIG. 8 is a cross-sectional view of an alternate embodiment of a touch pad of the present invention.

Furthermore, the electrode configuration need not be co-planar, but can be three dimensional to conform to a sphere, a cube, or other geometric shape. This design flexibility allows the invention to be used in a wide variety of applications, with substrates of varying shapes and composition. In some applications, it may not be necessary to actually touch substrate 35 upon or within which touch pad 22 and control circuit 24 are situated. For example, FIG. 8 illustrates a touch switch apparatus 20 wherein first and second electrodes E1 and E2 are mounted on an exterior surface 113 of a first pane 111 of a thermopane window 110 and which can be actuated by a user bringing a suitable stimulus 115 proximate an exterior surface 114 of an opposing pane 112 of the window.

Figure 9:
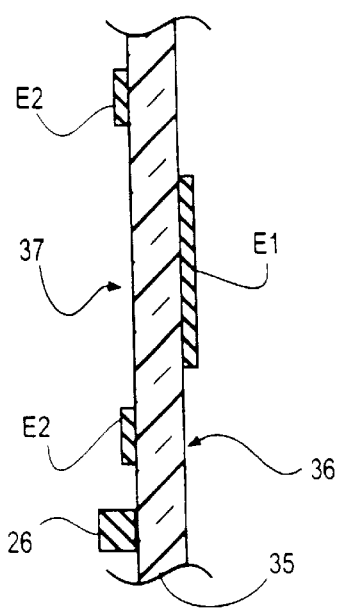
FIG. 9 is a cross-sectional view of another alternate embodiment of a touch pad of the present invention.

As noted above, first and second electrodes E1 and E2 need not be coplanar; they can be mounted on different sides or surfaces of a substrate, or on different substrates altogether. For example, FIG. 9 illustrates a touch switch apparatus 20 wherein first electrode E1 is mounted on a first surface 36 of a substrate 35 and second electrode E2 and IC chip 26 are mounted on a second, opposing surface 37 of substrate 35. In applications where first and second electrodes E1 and E2 are on the same side of a substrate, IC chip 26 can be mounted on the same side of the substrate as the electrodes, or on another side of the substrate. If the first and second electrodes are mounted on different surfaces of a substrate or on different substrates altogether, IC chip 26 can be mounted on the same surface as either of the electrodes, or on a different surface or substrate altogether. However, it is preferred that the IC chip 26 be mounted in close proximity to the electrodes.

Preferably, first electrode E1 is a solid conductor. However, first electrode E1 may also have a plurality of apertures or may have a mesh or grid pattern. In some embodiments, second electrode E2 will take the form of a narrow ribbon partially surrounding first electrode E2. In other embodiments, such as where first and second electrodes E1 and E2 are merely adjacent each other, second electrode E2 may also be a solid conductor or may have a mesh or grid pattern.

Control circuit 24 may be designed in many different ways, and it may be used with a variety of power sources, such as AC, periodically varying DC (such as a square wave), continuous DC, or others. FIGS. 4–7 illustrate a preferred control circuit design which may be easily adapted for use with a variety of power supplies, in a variety of operating modes. The FIG. 4 embodiment uses square wave DC power in a differential input, strobed mode of operation; the FIG. 5 embodiment uses continuous DC power in a differential input, continuous DC mode; the FIG. 6. embodiment uses square wave DC power in a single-ended input, strobed mode; and the FIG. 7 embodiment uses continuous DC power in a single-ended input, continuous DC mode.

It is apparent from FIGS. 4–7 that control circuit 24 can be readily adapted for various different operating modes. The foregoing four operating modes will be described in detail to demonstrate the design flexibility allowed by the invention. However, it should be recognized that the invention is by no means limited to these four operating modes. The particular operating mode and power source used in a specific application depends primarily on the requirements and specifications of the controlled device.

Boxed areas B1 and B2 on FIGS. 4–7 indicate the demarcation between components contemplated to be located on IC chip 26 and components located off of IC chip 26, such as electrodes E1 and E2, resistors R1 and R2, the controlled device (not shown), and input and output lines 30 and 32, respectively. The portions of FIGS. 4–7 which are outside boxed areas B1 and B2 are contemplated to be located on IC chip 26 and are identical for all four figures and operating modes depicted therein.

FIGS. 4–7 illustrate a control circuit 24 comprising a startup and bias section 40, a pulse generator and logic section 50, a decision circuit section 60, and a self-holding latch section 70, the functions of which will be described below. Each of the foregoing circuit sections 40, 50, 60 and 70 may be designed in a number of different ways, as would be known to those skilled in the art of electronic circuit design.

Control circuit 24 also comprises first, second, and third transistors P1, P2, and P3. In the embodiments described herein, transistors P1–P3 are P-MOS devices, although N-MOS devices, bipolar devices, or other transistor types can also be used. Control circuit 24 further comprises an inverter I1, first, second, and third diodes D1–D3, first and second capacitors C1 and C2, first, second, third, and fourth transistor switches SW1–SW4, and third and fourth resistors R3 and R4. It should be recognized that third and resistors R3 and R4 may be replaced with current sources.

In each of the embodiments illustrated in FIGS. 4–7, source terminal 77 of third transistor P3 and power input terminals 41, 51, 61, and 71 of startup and bias section 40, pulse generator and logic section 50, decision circuit 60, and self-holding latch section 70, respectively, are electrically coupled to terminal PIN8 of IC chip 26. Terminal PIN8 is in turn electrically coupled to control circuit 24 power input line 30, which is in turn electrically coupled to a power source 25. Typically, power source 25 is located at the controlled device (not shown).

A biasing output terminal 43 from startup and bias section 40 is electrically coupled to gate terminals G2 and G4 of second and fourth transistor switches SW2 and SW4, respectively. In the preferred embodiment and as described herein, first through fourth transistor switches SW1–SW4 are N-MOS devices, although other transistor types may be used, as well.

A power-on reset output 44 from startup and bias section 40 is electrically coupled to a power on reset input 54 at pulse generator and logic section 50. Power on reset output 44 of startup and bias section 40 is also electrically coupled to gate terminals G1 and G3 of first and third transistor switches SW1 and SW3.

Internal ground reference output 42 from the startup and bias section 40 is electrically coupled to low potential plates 102 and 103 of first and second capacitors C1 and C2, source terminals S1, S2, S3, and S4 of first through fourth transistor switches SW1–SW4, respectively, internal ground reference output 52 of the pulse generator and logic section 50, internal ground reference output 62 of decision circuit 60, anode 98 of third diode D3, low potential ends 96 and 97 of third and fourth resistors R3 and R4, and to terminal PIN6 of IC chip 26. The node thus described will hereinafter sometimes be referred to as the internal ground reference CHIP VSS.

A pulse output 53 from pulse generator and logic section output 50 is electrically coupled to source terminals 80 and 81 of first and second transistors P1 and P2, respectively, and to terminal PIN2 of IC 26. Gate terminal 82 of first transistor P1 is electrically coupled to terminal PIN1 of IC 26. Gate terminal 83 of second transistor P2 is electrically coupled to terminal PIN3 of IC 26.

Drain terminal 84 of first transistor P1 is electrically coupled to anode 90 of first diode D1 and to high potential end 94 of third resistor R3. Drain terminal 85 of second transistor P2 is electrically coupled to anode 91 of second diode D2 and to high potential end 95 of fourth resistor R4.

Cathode 92 of first diode D1 is electrically coupled to PLUS input terminal 64 of decision circuit 60, to drain terminals 86 and 87 of first and second transistor switches SW1 and SW2, and to high potential plate 100 of first capacitor C1. Cathode 93 of second diode D2 is electrically coupled to MINUS input terminal 66 of decision circuit 60, to drain terminals 88 and 89 of third and fourth transistor switches SW3 and SW4, and to high potential plate 101 of second capacitor C2.

Logic output 63 of decision circuit 60 is electrically coupled to input 75 of inverter I1 and to latch trigger input 73 of self-holding latch section 70. Output 72 of self-holding latch section 70 is electrically coupled to terminal PIN4 of IC 26.

In the illustrated embodiments, decision circuit section 60 is designed so that its output 63 is at a low potential when its PLUS and MINUS inputs 64 and 66, respectively, are at substantially equal potentials or when MINUS input 66 is at a substantially higher potential than PLUS input 64. Decision circuit section 60 output 63 is at a high potential only when PLUS input 64 is at a substantially higher potential than MINUS input 66.

Self-holding latch section 70 is designed so that no current flows through latch section 70 from the control circuit 24 power supply 25 to internal ground reference CHIP VSS and through third diode D3 when decision circuit section 60 logic output 63 is at a low potential. However, when decision circuit 60 section logic output 63 is at a high potential, latch trigger input 73 is at a high potential, thus triggering latch circuit 70 and enabling current to flow through latch section 70 from control circuit 24 power supply 25 to internal ground reference CHIP VSS and through third diode D3, by way of latch 70 power input and output terminals 71 and 72, respectively. Once latch 70 has been triggered, it remains triggered, or sealed in, until power is removed from control circuit 24. The design and construction of a latch section which operates in this manner is known to those skilled in the art and need not be described in detail herein.

Output terminal 76 of inverter I1 is electrically coupled to gate terminal 78 of third transistor P3. Drain terminal 79 of third transistor P3 is electrically coupled to terminal PIN7 of IC 26.

Third diode D3 is provided to prevent back-biasing of control circuit 24 when touch switch apparatus 20 is used in multiplexed applications. It can be omitted in applications where only a single touch pad 22 is used, or where multiple touch pads 22 are used, but not multiplexed.

The foregoing description of the basic design of control circuit 24 is identical for each of the four operating modes depicted in FIGS. 4–7. The distinctions in overall apparatus configuration among the four operating modes lie primarily in the external terminal connections of IC 26, as will be described in detail below.

Figure 4:
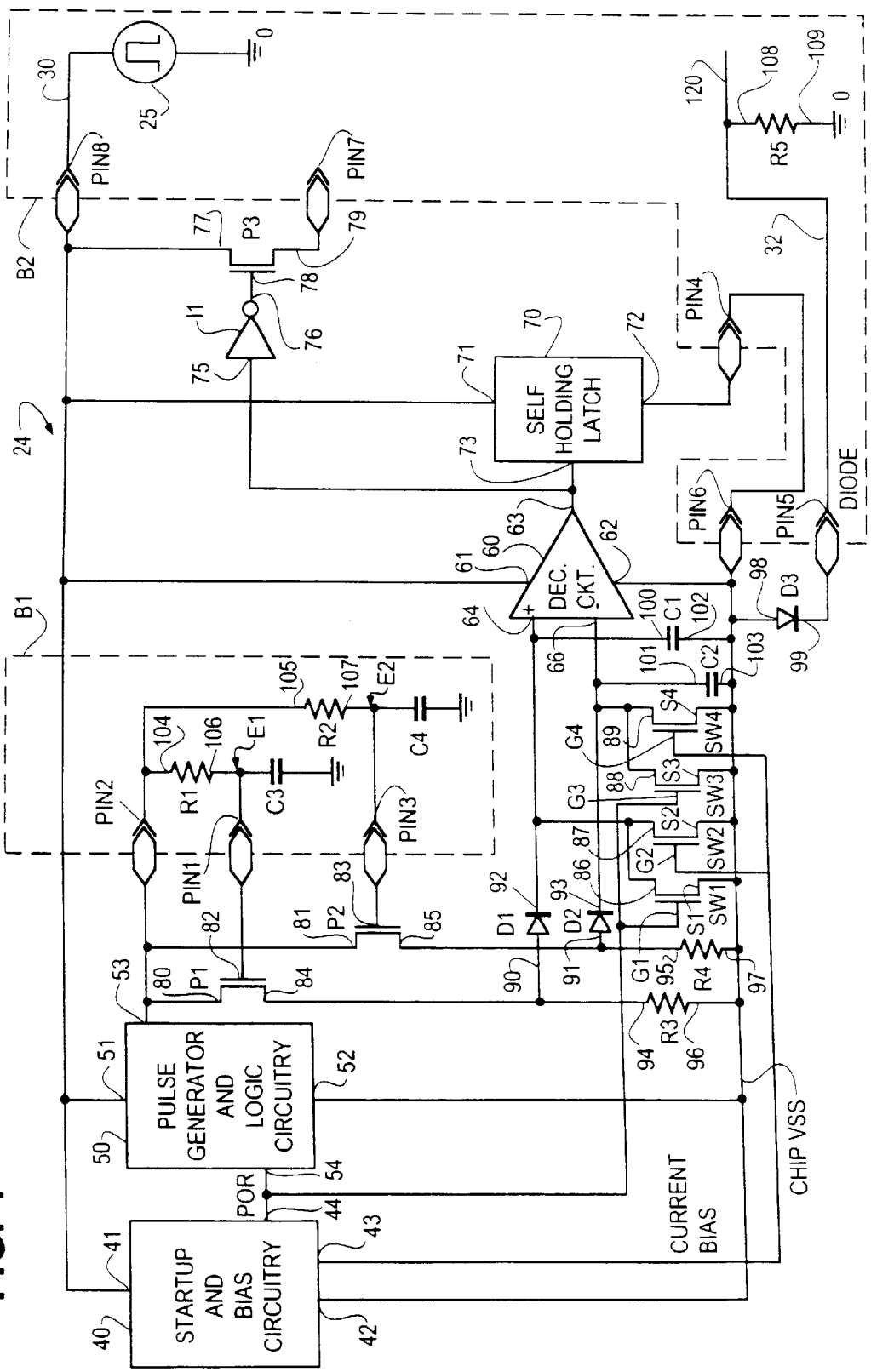
FIG. 4 is an electrical schematic representation of a touch switch control circuit configured for a preferred operating mode.

FIG. 4 illustrates a touch switch apparatus 20 configured for operation in differential input strobed mode, as described below. Control circuit 24 for operation in this mode is configured as described hereinabove for FIGS. 4–7 generally. Terminal PIN2 of IC 26 is electrically coupled to high potential ends 104 and 105 of first and second resistors R1 and R2, respectively. Terminal PIN1 of IC 26 is electrically coupled to both low potential end 106 of first resistor R1 and to first electrode E1. Terminal PIN3 of IC 26 is electrically coupled to both low potential end 107 of second resistor R2 and to second electrode E2.

The circuit elements represented as C3 and C4 in FIGS. 4–7 are not discrete electrical components. Rather, reference characters C3 and C4 represent the capacitance-to-ground of first and second electrodes E1 and E2, respectively.

Terminal PIN8 of IC 26 is electrically coupled to input line 30, which is in turn electrically coupled to a power signal source 25 at, for example, the controlled device (not shown). Terminal PIN4 of IC 26 is electrically coupled to terminal PIN6 of IC 26, thereby electrically coupling output terminal 72 of latch 70 to the internal ground reference CHIP VSS and anode 98 of third diode D3. Terminal PIN7 of IC chip 26 is not externally terminated in this embodiment. Terminal PIN5 of IC 26 is electrically coupled to output line 32, which is in turn electrically coupled to high potential end 108 of fifth resistor R5 and to output line 120, which is connected to the controlled device (not shown), either directly or by way of a processor or other intermediate device (not shown). Low potential end 109 of resistor R5 is electrically coupled to the system ground. In a typical application, resistor R5 will be at a substantial distance from the other components comprising touch switch apparatus 20. That is, in the preferred embodiment, resistor R5 is contemplated not to be near touch pad 22 and control circuit 24.

Figure 5:
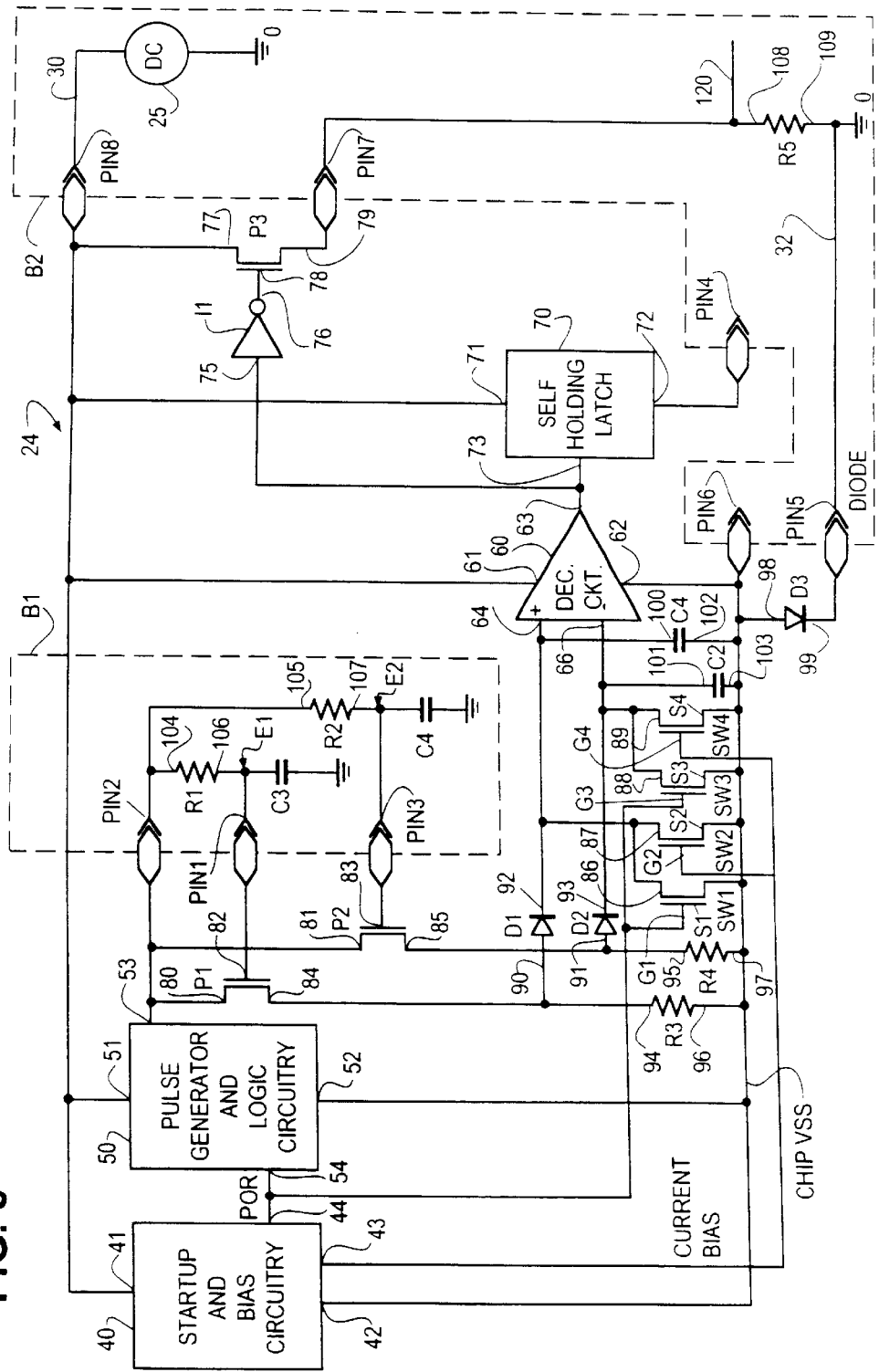
FIG. 5 is an electrical schematic representation of a touch switch control circuit configured for an alternate preferred operating mode.

FIG. 5 illustrates a typical touch switch control circuit 24 configured for operation in differential input continuous DC mode, as described below. The overall control circuit and apparatus is identical to that described for FIG. 4 hereinabove, with three exceptions. First, in the FIG. 5 embodiment, terminal PIN7 of IC 26 is electrically coupled to high potential end 108 of resistor R5 and to output line 120, which is connected to the controlled device (not shown) either directly or by way of a processor or other intermediate device (not shown), whereas terminal PIN7 is not externally terminated in the FIG. 4 embodiment. Second, in the FIG. 5 embodiment, terminals PIN4 and PIN6 of IC 26 are not electrically coupled to each other or otherwise externally terminated, whereas they are in the FIG. 4 embodiment. Third, in the FIG. 5 embodiment, terminal PIN5 of IC 26 is electrically coupled to low potential end 109 of resistor R5, whereas in the FIG. 4 embodiment, terminal PIN5 of IC 26 is electrically coupled to high potential end 108 of fifth resistor and to the controlled device (not shown). As in the FIG. 4 embodiment, fifth resistor R5 will typically be at a substantial distance from the other components comprising touch switch apparatus 20.

Figure 6:
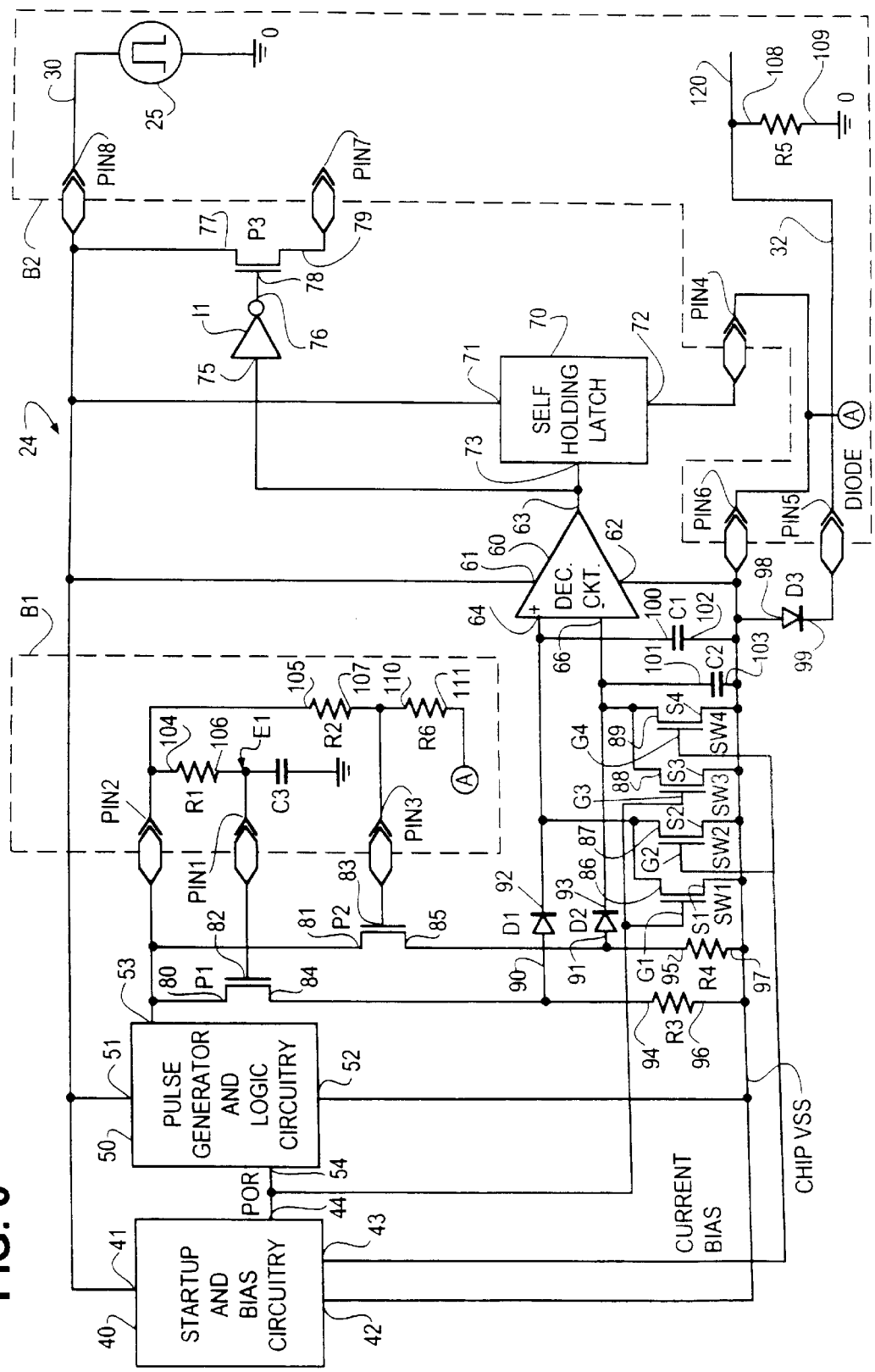
FIG. 6 is an electrical schematic representation of a touch switch control circuit configured for another alternate preferred operating mode.

FIG. 6 illustrates a typical touch switch control circuit configured for operation in single-ended input strobed mode, as described below. Control circuit 24 is configured as described hereinabove for FIGS. 4–7 generally. Terminal PIN2 of IC 26 is electrically coupled to high potential ends 104 and 105 of first and second resistors R1 and R2, respectively. Terminal PIN1 of IC 26 is electrically coupled to both low potential end 106 of first resistor R1 and to first electrode E1. Terminal PIN3 of IC 26 is electrically coupled to both low potential end 107 of second resistor R2 and to high potential end 110 of sixth resistor electrode R6, such that second resistor R2 and sixth resistor R6 form a voltage divider. Low potential end 111 of sixth resistor R6 is electrically coupled to internal ground reference CHIP VSS, typically at a point proximate terminal PIN5 of IC 26. In FIG. 6, the electrical connection of sixth resistor R6 to the internal ground reference CHIP VSS is represented by broken line "A—A" for clarity.

Terminal PIN8 of IC 26 is electrically coupled to input line 30, which is in turn electrically coupled to a power signal source 25. Terminal PIN5 of IC 26 is electrically coupled to output line 32, which is in turn electrically coupled to high potential end 108 of fifth resistor R5 and to output line 120. Output line 120 is electrically coupled to the controlled device (not shown), either directly or by way of a processor or other intermediate device. Terminal PIN4 of IC 26 is electrically coupled to terminal PIN6 of IC 26. Terminal PIN7 of IC 26 is not externally terminated in this embodiment. In a typical application, fifth resistor R5 will be at a substantial distance from the other components comprising touch switch apparatus 20.

Figure 7:
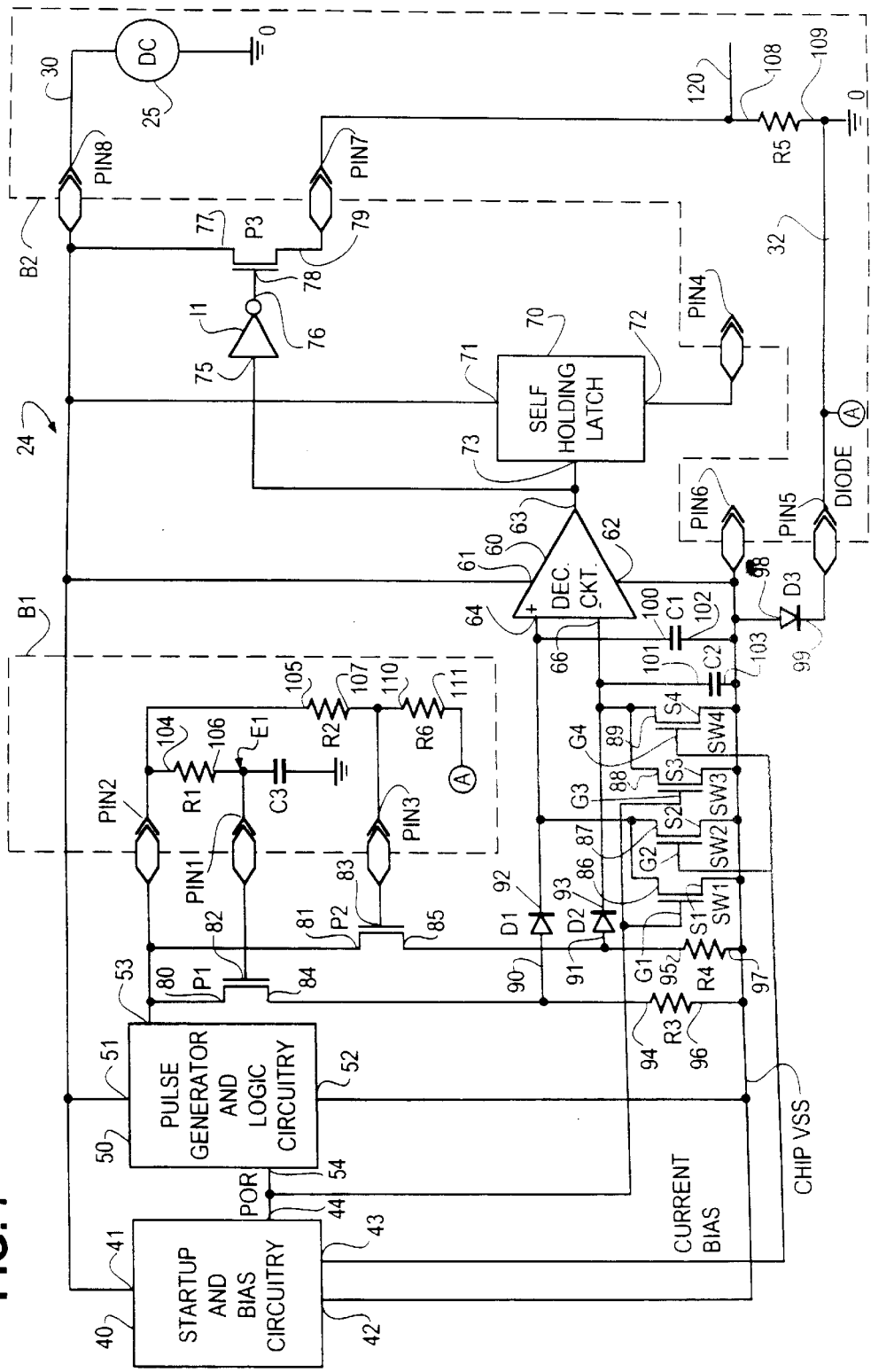
FIG. 7 is an electrical schematic representation of a touch switch control circuit configured for yet another alternate preferred operating mode.

FIG. 7 illustrates a typical touch switch control circuit configured for operation in single ended input continuous DC mode, as described below. Control circuit 24 is configured as described hereinabove for FIGS. 4–7 generally. The overall control circuit and apparatus is identical to that described for FIG. 6 hereinabove, with three exceptions. First, in the FIG. 7 embodiment, terminal PIN7 of IC 26 is electrically coupled to high potential end 108 of fifth resistor R5 and to output line 120, which is in turn connected to the controlled device (not shown), typically by way of a microprocessor or other controller (not shown). Terminal PIN7 of IC 26 is not externally terminated in the FIG. 6 embodiment. Second, in the FIG. 7 embodiment, terminals PIN4 and PIN6 of IC 26 are not electrically coupled or otherwise externally terminated, whereas they are in the FIG. 6 embodiment. Third, in the FIG. 7 embodiment, terminal PIN5 of IC 26 is electrically coupled to low potential end 109 of fifth resistor R5, whereas in the FIG. 6 embodiment, terminal PIN5 of IC 26 is electrically coupled to high potential end 108 of fifth resistor and to output line 120. In a typical application, fifth resistor R5 will be at a substantial distance from the other components comprising touch switch apparatus 20. In FIG. 7, the electrical connection of sixth resistor R6 to the internal ground reference CHIP VSS is represented by broken line "A—A" for clarity.

A touch switch apparatus 20 configured for the differential input strobed mode operates as follows. Referring to FIG. 4, a power/control signal 25 is provided to terminal PIN8 of IC 26 and, in turn, to power input terminals 41, 51, 61, and 71 of start up and bias section 40, pulse generator and logic section 50, decision circuit section 60, and self-holding latch section 70, respectively.

Upon becoming powered, and after a suitable delay interval to allow for stabilization (approximately 200 microseconds is sufficient), start up and bias section 40 outputs a short duration power-on reset signal from output terminal 44 to gate terminals G1 and G3 of first transistor switch SW1 and third transistor switch SW3, respectively, causing first and third transistor switches SW1 and SW3 to turn on, and thus providing a current path from high potential plates 100 and 101 of first and second capacitors C1 and C2, respectively, to the internal ground reference CHIP VSS. The power on reset signal duration is sufficient to allow any charge present on first and second capacitors C1 and C2 to be substantially completely discharged to the internal ground reference CHIP VSS. In this manner, PLUS and MINUS inputs 64 and 66 to decision circuit section 60 attain an initial low-potential state.

At substantially the same time, start up and bias circuit 40 sends a power on reset signal from output 44 to input 54 of pulse generator and logic section 50, thus initializing it. After a suitable delay to allow pulse generator and logic section 50 to stabilize, pulse generator and logic section 50 generates a pulse and outputs it from pulse output terminal 53 to first and second electrodes E1 and E2 by way of first and second resistors R1 and R2, and to source terminals 80 and 81 of first and second transistors P1 and P2, respectively. The pulse may be of any suitable waveform, such as a square wave pulse.

Startup and bias circuit 40 also outputs a bias voltage from bias output 43 to gate terminals G2 and G4 of second and fourth transistor switches SW2 and SW4, respectively. The bias voltage is out of phase with the pulse output to first and second electrodes E1 and E2. That is, when the pulse output is at a high state, the bias voltage output is at a low state and when the pulse output is at a low state, the bias voltage output is at a high state.

When a pulse is applied to first and second electrodes E1 and E2 through first and second resistors R1 and R2, respectively, the voltage at gate terminals 82 and 83 of first and second transistors P1 and P2 is initially at a lower potential than that at source terminals 80 and 81 of first and second transistors P1 and P2, respectively, thus biasing first and second transistors P1 and P2 and causing them to turn on. With first and second transistors P1 and P2 turned on, current will flow through third and fourth resistors R3 and R4, thus creating a peak potential at anode terminals 90 and 91 of first and second diodes D1 and D2, respectively.

If the peak potential at anodes 90 and 91 of first and second diodes D1 and D2 is higher than the potential across first and second capacitors C1 and C2, a peak current is established through first and second diodes D1 and D2, causing first and second capacitors C1 and C2 to become charged, and establishing a peak potential at each of PLUS and MINUS inputs 64 and 66 to decision circuit section 60. This situation will occur, for example, following the first pulse after control circuit 24 has been initialized because first and second capacitors C1 and C2 will have become discharged upon startup, as described above.

As is evident to one skilled in the art, the biasing of first and second transistors P1 and P2, the current through third and fourth resistors R3 and R4, the peak potential created at anodes 90 and 91 of first and second diodes D1 and D2, and the peak potential created at each of PLUS and MINUS inputs 64 and 66 to decision circuit 60 are proportional to the condition of the electric field at first and second electrodes E1 and E2. The condition of the electric field proximate electrodes E1 and E2 will vary in response to stimuli present proximate the electrodes.

With control circuit 24 activated, as described above, and with no stimuli present proximate either first and second electrodes E1 and E2, the potentials at each of PLUS and MINUS inputs 64 and 66 to decision circuit 60 are in what may be termed a neutral state. In the neutral state, the potentials at each of PLUS and MINUS inputs 64 and 66 may be substantially equal. However, in order to prevent unintended actuations, it may be desirable to adjust control circuit 24 so that the neutral state of MINUS input 66 is at a somewhat higher potential than the neutral state of PLUS input 64. This adjustment may be effected by varying the configurations of first and second electrodes E1 and E2 and the values of first and second resistors R1 and R2 to achieve the desired neutral state potentials. Regardless of the neutral state potentials, it is contemplated that decision circuit 60 output 63 will be at a low potential unless PLUS input 64 is at a substantially higher potential than MINUS input 66.

With decision circuit 60 output 63 at a low potential, inverter I1 causes the potential at gate terminal 78 of third transistor P3 to be at a high level, substantially equal to the potential at source terminal 77. In this state, third transistor P3 is not biased and will remain turned off. However, in this embodiment, terminal PIN7 of IC 26 is not terminated. Drain terminal 79 of third transistor P3 is therefore in an open-circuit condition, and the state of third transistor P3 is of no consequence to the function of the apparatus. Also, with decision circuit 60 output 63, and consequently latch trigger input 73, at a low state, self holding latch circuit 70 will not be triggered, and no current will flow through latch 70 from power supply 25 to the internal ground reference CHIP VSS and through third diode D3.

Over a period of time which is determined by the pulse voltage, the values of first and second resistors R1 and R2, and the capacitance to ground of first and second electrodes E1 and E2 (represented in the figures as virtual capacitors C3 and C4), the potential at first and second electrodes E1 and E2 eventually rises to substantially equal the pulse voltage and thus the voltage at source terminals 80 and 81 of first and second transistors P1 and P2, thus unbiasing first and second transistors P1 and P2. When this state is reached, first and second transistors P1 and P2 turn off, and the potentials at anodes 90 and 91 of first and second diodes D1 and D2 begin to decrease at a substantially equal rate towards the internal ground reference CHIP VSS level. Eventually, the anode potential at each of first and second diodes D1 and D2 is likely to fall below the respective cathode potential. At this point, diodes D1 and D2 become reverse biased and prevent first and second capacitors C1 and C2 from discharging.

When the pulse on output 53 goes to a low state, the bias voltage output goes to a high state relative to the internal ground reference CHIP VSS, and applies the elevated bias voltage to gate terminals G2 and G4 of second and fourth transistor switches SW2 and SW4. In this state, second and fourth transistor switches SW2 and SW4 become slightly biased and turn on sufficiently to effect a slow, controlled discharge of first and second capacitors C1 and C2 to the internal ground reference CHIP VSS. When the pulse next goes to a high state, the bias voltage will return to a low state, second and fourth transistor switches SW2 and SW4 will turn off, and the circuit will respond as described initially.

If a stimulus is present at or near second electrode E2 when the pulse from pulse generator and logic section 50 goes to a high potential, first transistor P1 will operate as described hereinabove. That is, first transistor P1 will be initially biased and will allow some current to flow through third resistor R3, creating a peak potential at anode 90 of first diode D1, and allowing a peak current to flow through first diode D1, thereby charging first capacitor C1, and establishing a peak potential at PLUS input 64 to decision circuit 60. Once the voltage at first electrode E1 has stabilized in response to the incoming pulse, first transistor P1 will become unbiased and will turn off.

Second transistor P2 operates in much the same way, except that the presence of the stimulus proximate second electrode E2 will alter the RC time constant for that circuit segment, thus lengthening the time required for the potential at second electrode E2 to stabilize. As a consequence, second transistor P2 will remain biased on for a longer period of time than first transistor P1, allowing a greater peak current to flow through fourth resistor R4 than flows through third resistor R3, thus generating a peak potential at anode 91 of second diode D2 which is greater than the peak potential present at anode 90 of first diode D1. Consequently, a peak current will flow through second diode D2, causing second capacitor C2 to become charged, ultimately resulting in a peak potential at MINUS input 66 to decision circuit 60 which is greater than the peak potential at PLUS input 64 to decision circuit. Since decision circuit 60 is configured so that its output will be at a low potential when the potential at MINUS input 66 is greater than or substantially equal to the potential at the PLUS input 64, decision circuit 60 output terminal 63 will be at a low potential.

With decision circuit 60 output terminal 63, and consequently latch trigger input terminal 73, at a low potential, self holding latch 70 will not be triggered. Inverter I1 and third transistor P3 will operated as described previously, although, again, the state of third transistor P3 is inconsequential in this configuration.

In the event that a contaminant or foreign object, or other stimulus, substantially covers, or is applied to, both first and second electrodes E1 and E2, the system will respond much in the same way as it would when no stimulus is present at either the first electrode or second electrode. However, with contaminants or a foreign object present proximate both electrodes E1 and E2, the RC time constant for those segments of the circuit will be altered such that it will take longer for the voltage at both first and second electrodes E1 and E2, respectively, to substantially equalize with the pulse voltage. Consequently, both first and second transistors P1 and P2 will turn on and will allow more current to flow through third and fourth resistors R3 and R4 than they would in a condition where neither first nor the second electrode E1 or E2 is affected by a stimulus. However, first and second transistors P1 and P2 will be substantially equally biased. Therefore, a substantially equal peak potential will be developed at anodes 90 and 91 of both first and second diodes D1 and D2, causing a substantially equal peak current to flow through first and second diodes D1 and D2, charging first and second capacitors C1 and C2, and establishing a substantially equal peak potential at both PLUS and MINUS inputs 64 and 66 to decision circuit 60. In this state, decision circuit section 60 output terminal 63 will be at a low potential, latch trigger input terminal 73 of self holding latch 70 will be at a low potential, and latch 70 will remain untriggered. As previously described, the state of inverter I1 and third transistor P3 is inconsequential in this embodiment.

In the situation where a stimulus is applied proximate first electrode E1, but not second electrode, second transistor P2 will be initially biased and will turn on, establishing a current through fourth resistor R4, and generating a peak potential at anode terminal 90 of second diode D2. A peak current will flow through second diode D2, charging second capacitor C2, and establishing a peak potential at MINUS input 66 of decision circuit section 60. As the voltage at gate terminal 81 of second transistor P2 rises to the level of the pulse voltage, second transistor P2 will become unbiased and will turn off. Second diode D2 will then become reverse biased, and will prevent second capacitor C2 from discharging.

As is evident to one skilled in the art, the presence of a stimulus proximate first electrode E1 will lengthen the time required for the potential at first electrode E1 to stabilize. As a consequence, first transistor P1 will remain biased on for a longer period of time than second transistor P2, allowing a greater peak current to flow through third resistor R3 than through fourth resistor R4, thus generating a peak potential at anode 90 of first diode D1 which is greater than the potential present at anode 91 of second diode D2. Consequently, a peak current of greater magnitude and/or duration will flow through first diode D1 than through second diode D2, causing first capacitor C1 to become charged, ultimately resulting in a peak potential at PLUS input 64 to decision circuit 60 which is substantially greater than the peak potential at MINUS input 66 to decision circuit 60. Since decision circuit 60 is configured so that output terminal 63 will be at a high state when the potential at PLUS input 64 is greater than the potential at MINUS input 66, decision circuit 60 output 63 will be at a high potential.

With decision circuit 60 output 63 at a high potential, inverter I1 will cause potential at gate terminal 78 of third transistor P3 to be low relative to the potential at source terminal 77, thus biasing third transistor P3, and causing it to turn on. However, since terminal PIN7 of IC 26 is not terminated in this embodiment, the state of third transistor P3 is of no consequence.

With decision circuit 60 output terminal 63 at a high potential, self holding latch circuit 70 trigger input terminal 73 will also be at a high potential, thus triggering latch 70. When self holding latch 70 is triggered, a current path is established from power supply 25 to internal ground reference CHIP VSS and through third diode D3, effectively short circuiting the remainder of control circuit 24, including startup and bias section 40, pulse generator and logic section 50, and decision circuit section 60. In this state, those sections of control circuit 24 become substantially de-energized and cease to function.

Once triggered, self holding latch 70 will remain triggered, regardless of the subsequent state of stimuli proximate either or both of electrodes E1 and E2. Latch 70 will reset when the power from the power supply 25 goes to a near zero state, such as when the square wave strobe signal from power supply 25 of this example falls to zero.

While self holding latch 70 is in the triggered state, a steady state signal will be supplied through fifth resistor R5 and back to the controlled device (not shown). In this manner, touch switch apparatus 20 emulates the change of state associated with a maintained-contact mechanical switch.

Referring now to FIG. 5, the operation of a touch switch apparatus 20 configured for the differential input continuous DC mode is as follows. The control circuit 24, up to and including decision circuit 60, performs in substantially the same manner as when configured for the differential input strobed mode of operation, as described above with reference to FIG. 4. That is, with no stimulus present proximate either first or second electrodes E1 and E2, with a stimulus present proximate both first and second electrodes E1 and E2, or with a stimulus present proximate second electrode E2, but not first electrode E1, the decision circuit 60 output 63 will be at a low potential. With a stimulus present proximate first electrode E1, but not second electrode E2, the decision circuit 60 output 63 will be at a high level.

As can be readily seen in FIG. 5, self holding latch circuit 70 output 72 is not terminated in this embodiment, and the self holding latch 70 is therefore inoperative in differential input DC mode. However, drain terminal 79 of third transistor P3 is electrically coupled to internal ground reference CHIP VSS and to output line 32 in this embodiment, and it therefore becomes an operative part of control circuit 24. When decision circuit 60 output 63 is at a low potential, inverter I1 causes the potential at gate terminal 78 of third transistor P3 to be at a high potential, substantially equal to the potential source terminal 77. In this state, third transistor P3 is not biased and does not turn on. When decision circuit 60 output 63 is at a high potential, inverter I1 causes the potential at gate terminal 78 of third transistor P3 to be at a low potential compared to the potential at source terminal 77. In this state, third transistor P3 is biased and turns on, allowing current to be established through third transistor P3 and fifth resistor R5. Output line resistor R5 limits the current through third transistor P3 such that the balance of control circuit 24 is not short circuited and remains operative.

In the DC mode shown in FIG. 5, control circuit 24 also responds to the removal of the stimulus from the proximity of first electrode E1. So long as a stimulus remains present proximate first electrode E1, but not second electrode E2, each time the pulse goes to a high state, a peak potential will be created at anode 90 of first diode D1 which is higher than the peak potential at anode 91 of second diode D2. Consequently, the peak potential at PLUS input 64 to decision circuit 60 will be at a higher level than the peak potential at MINUS input 66 and control circuit 24 will behave as described above. When the stimulus is removed, however, and no stimulus is present proximate either first electrode E1 or second electrode E2, the charge on first capacitor C1 will eventually discharge to a neutral state by means of the biasing function of second transistor switch SW2. At this point, the potential at PLUS input 64 of decision circuit 60 will no longer be higher or substantially higher than the potential at MINUS input 66, and decision circuit 60 output 63 will return to a low state.

In this manner, touch switch apparatus 20 operating in differential input DC mode emulates a momentary contact, push-to-close and release-to-open, mechanical switch. It should be recognized that, with minor revisions, the control circuit could be configured to emulate a push-to-open and release-to-close mechanical switch.

Referring now to FIG. 6, touch switch apparatus 20 configured for the single ended input strobed mode of operation operates as follows. When a pulse is applied to first electrode E1 and first and second resistors R1 and R2, current flows through second resistor R2 and sixth resistor R6. Second and sixth resistors R2 and R6 are configured as a voltage divider; that is, when the pulse output is in a high state, gate terminal 83 of second transistor P2 will be at a lower potential than source terminal 81 of second transistor P2. Therefore, when pulse output 53 is in a high state, second transistor P2 will be continuously biased and will allow a constant current to flow through fourth resistor R4, thus creating a reference potential at anode 91 of second diode D2. The reference potential at anode 91 of second diode D2 will establish a current through second diode D2, causing second capacitor C2 to become charged, and thus creating a reference potential at MINUS input 66 to decision circuit 60. When the reference potential at MINUS input 66 becomes substantially equal to the reference potential at anode 91 of second diode D2, the current through second diode D2 will cease.

Concurrently, with no stimulus present at first electrode E1, the pulse applied to source terminal 80 of first transistor P1 and to first electrode E1 will initially cause first transistor P1 to become biased and to turn on. A current will thus be established through third resistor R3 and a peak potential will be created at anode 90 of first diode D1. The peak potential will establish a peak current through first diode D1, charging first capacitor C1 and creating a peak potential at PLUS input 64 of the decision circuit. Resistors R1, R2, R3, R4, and R6 are selected so that when no stimulus is present proximate first electrode E1, the reference potential at MINUS input 66 of decision circuit 60 will be greater than or equal to the peak potential at to PLUS terminal 64 of decision circuit 60.

In this state, output 63 of the decision circuit 60 will be at a low potential and self holding latch 70 will not be triggered. Also, inverter I1 will cause the potential at gate terminal 78 of third transistor P3 to be at a high state, substantially equal to the source terminal 77 potential, so that third transistor P3 is unbiased and remains turned off. However, this is of no consequence since drain terminal 79 of third transistor P3 is in an open-circuit condition in this embodiment.

This embodiment does not require a second electrode, although a two-electrode touch pad may be adapted for use in this mode. In the event a two-electrode touch pad is adapted for use in this mode of operation, the presence or absence of a stimulus proximate the second electrode has no effect on the operation of the circuit.

In the event that a stimulus is present proximate first electrode E1, the operation of second transistor P2 is the same as described hereinabove for this embodiment. However, the presence of the stimulus proximate first electrode E1 will cause a greater time to be required for the voltage at gate terminal 82 of first transistor P1 to become equalized with source terminal 80 potential at first transistor. Consequently, first transistor P1 will be turned on and will allow a relatively greater current to flow through third resistor R3, compared to the current that second transistor P2 allows to flow through fourth resistor R4. As a result, the peak potential at anode 90 of first diode D1 will be greater than the reference potential at anode 91 of second diode D2. As a result, the peak potential at PLUS input 64 of decision circuit 60 will be greater than the reference potential at MINUS input 66 of decision circuit 60, and output 63 from decision circuit 60 will therefore be at a high state. With output 63 of decision circuit 60 at a high state, inverter I1 causes the potential at gate terminal 78 of third transistor P3 to be at a low state, thus turning transistor P3 on. However, since drain terminal 79 of third transistor P3 is effectively not terminated, this is of no consequence.

With output 63 of decision circuit 60 at a high state, latch trigger input 73 is at a high state, and self holding latch 70 is triggered, thus establishing a current path through latch section 70, from power supply 25 to internal ground reference CHIP VSS and through third diode D3, thereby effectively short circuiting the balance of control circuit 24. Self holding latch 70 will remain in this state until power to latch input terminal 71 is removed. Until latch 70 is thus reset, a continuous digital control signal is output to the controlled device (not shown). In this manner, touch switch apparatus 20 emulates a change of state associated with a mechanical switch.

Referring now the FIG. 7, a touch switch apparatus 20 configured for operation in the single ended input continuous DC mode operates as follows. The operation and functionality of control circuit 24 is substantially the same as described for the single ended input, strobed mode as described hereinabove with reference to FIG. 6. However, in the single ended input, DC mode, self holding latch output 72 is open circuited and self holding latch 70 is therefore not operative.

With no stimulus applied to first electrode E1, output 63 of decision circuit 60 is at a low potential. Consequently, inverter I1 output 76 to gate terminal 78 of third transistor P3 is at a high potential. With gate terminal 78 of third transistor P3 at a high potential, similar to the potential at source terminal 77, third transistor P3 is unbiased and does not turn on, and therefore no current flows through third transistor P3 or through fifth resistor R5.

With a stimulus proximate first electrode E1, output 63 of decision circuit 60, and consequently input 75 to inverter I1, is at a high state. Inverter I1 changes the high level input to a low level output, and provides output 76 to gate terminal 78 potential of third transistor P3. With gate terminal 78 at a low potential compared to source terminal 77, third transistor P3 is biased, it turns on, and current flows through third transistor P3 and fifth resistor R5. This creates an elevated potential at anode 108 of fifth resistor R5 which may be used as an input to the controlled device (not shown) via output line 120.

In the continuous DC mode of FIG. 7, the control circuit responds to the removal of the stimulus from the proximity of first electrode E1. So long as the stimulus remains present proximate first electrode E1, each time the pulse goes to a high state, a peak potential will be created at anode 90 of first diode D1 which is higher than the reference potential at anode 91 of second diode D2. Consequently, the peak potential at PLUS input 64 to the decision circuit 60 will be at a higher level than the reference potential at the MINUS input 66 and control circuit 24 will behave as described above. When the stimulus is removed from first electrode E1, the charge on first capacitor C1 will eventually discharge to a neutral state by means of the biasing function of second transistor switch SW2. At this point, the peak potential at PLUS input 64 of decision circuit 60 will no longer be higher or substantially higher than the reference potential at MINUS input 66, and decision circuit 60 output 63 will return to a low state.

In this manner, touch switch apparatus 20 operating in single-ended input DC mode emulates a momentary contact mechanical switch. With minor revisions, the control circuit could be configured to emulate a push-to-open and release-to-close mechanical switch.

Figure 10:
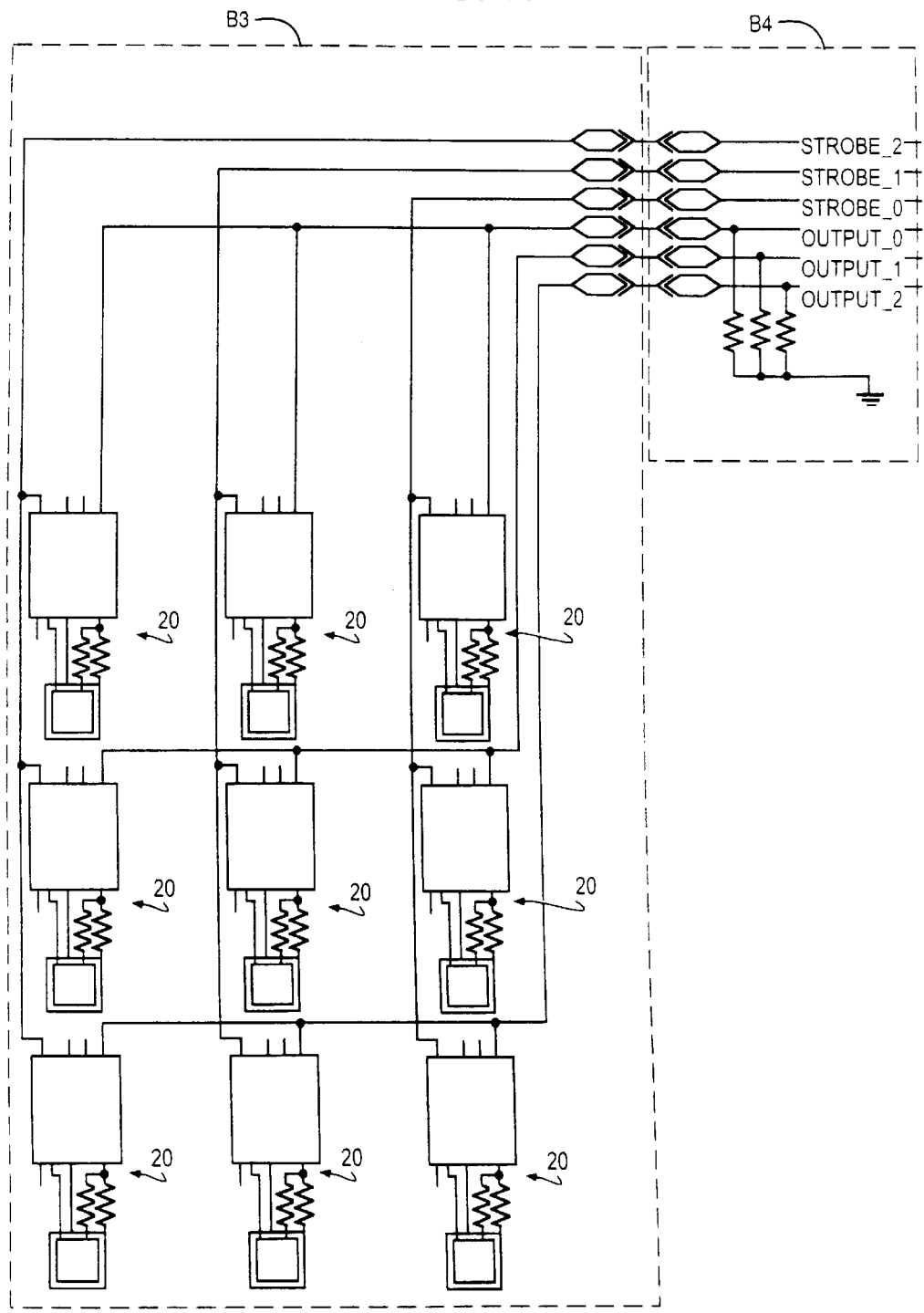
FIG. 10 is a diagrammatic representation of an embodiment of a touch switch panel using a plurality of touch switches in matrixed form.

Thus far, this specification has described the physical construction and operation of a single touch switch. Typical touch switch applications frequently involve a plurality of touch switches which are used to effect control over a device. FIG. 10 shows a switch panel comprising nine touch switches 20, where the nine touch switches 20 are arranged in a three-by-three matrix. Box B3 represents components at the touch panel, while box B4 represents components at the controlled device. Although any number of touch switches could theoretically be laid out in any manner, matrix layouts such as this one are readily multiplexable, reducing the number of necessary input and output lines from the controlled device, and are preferred.

While several embodiments of the present invention have been shown, it will be obvious to those skilled in the art that numerous modifications may be made without departing from the spirit of the claims appended hereto.

What is claimed is:

1. An electrical switch apparatus responsive to human proximity and adapted to control a controlled device, comprising:

a touch pad;

an integrated circuit coupled to said touch pad, wherein said integrated circuit comprises a startup and bias section, a pulse generator and logic section, a decision section, and a self holding latch section; and a control line coupled to said integrated circuit, said control line further coupled to said controlled device;

wherein the distance between said integrated circuit and said controlled device is substantially greater than the distance between said integrated circuit and said touch pad.

2. The apparatus of claim 1 further comprising at least a first active element coupled to said touch pad, said pulse generator and logic section, and said decision section.

3. The apparatus of claim 2 wherein said touch pad comprises at least a first electrode, said first active element coupled to said first electrode, said pulse generator and logic section, and said decision section.

4. The apparatus of claim 3 further comprising a second active element, said second active element coupled to said second electrode said pulse generator and logic section, and said decision section.

5. The apparatus of claim 4 wherein said touch pad further comprises a second electrode, said second active element coupled to said second electrode, said pulse generator and logic section, and said decision section.

6. The apparatus of claim 1 wherein said control line is coupled to said decision section.

7. The apparatus of claim 1 wherein said control line is coupled to said self holding latch section.

8. An electrical switch apparatus responsive to human proximity and adapted to control a controlled device, comprising:

a first electrode;

a second electrode;

an integrated circuit coupled to said first electrode and said second electrode, wherein said integrated circuit comprises a startup and bias section, a pulse generator and logic section, a decision section, and a self holding latch section; and a control line coupled to said integrated circuit, said control line further coupled to said controlled device;

wherein the length of said control line is substantially greater than the distance between said integrated circuit and said touch pad.

9. The apparatus of claim 8 further comprising a first active element, said first active element coupled to said first electrode, said pulse generator and logic section, and said decision section.

10. The apparatus of claim 9 further comprising a second active element, said second active element coupled to said second electrode, said pulse generator and logic section, and said decision section.

11. The apparatus of claim 8 wherein said control line is coupled to said decision section.

12. The apparatus of claim 8 wherein said control line is coupled to said self holding latch section.

* * * * *